(12) United States Patent
Voldman

(10) Patent No.: US 7,989,282 B2
(45) Date of Patent: Aug. 2, 2011

(54) STRUCTURE AND METHOD FOR LATCHUP IMPROVEMENT USING THROUGH WAFER VIA LATCHUP GUARD RING

(75) Inventor: Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 107 days.

(21) Appl. No.: 12/411,624

(22) Filed: Mar. 26, 2009

(65) Prior Publication Data
US 2010/0244179 A1 Sep. 30, 2010

(51) Int. Cl.
*H01L 21/8238* (2006.01)

(52) U.S. Cl. ........ 438/199; 438/197; 438/510; 438/712; 257/E21.051; 257/E21.182; 257/E21.218; 257/E21.247; 257/E21.304; 257/E21.421; 257/E21.585

(58) Field of Classification Search .......... 438/197, 438/199, 142, 208, 510, 692, 700, 712, 933; 257/E21.051, 182, 247, 421, 304, 585
See application file for complete search history.

(56) References Cited

U.S. PATENT DOCUMENTS

| | | | | |
|---|---|---|---|---|
| 5,828,110 A | * | 10/1998 | Wollesen | 257/373 |
| 5,945,713 A | * | 8/1999 | Voldman | 257/355 |
| 5,973,396 A | | 10/1999 | Farnworth | |
| 6,278,181 B1 | | 8/2001 | Maley | |
| 6,313,512 B1 | | 11/2001 | Schmitz et al. | |
| 6,583,470 B1 | | 6/2003 | Maki et al. | |
| 7,335,972 B2 | | 2/2008 | Chanchani | |
| 7,355,273 B2 | | 4/2008 | Jackson et al. | |
| 7,401,311 B2 | * | 7/2008 | Voldman | 716/8 |
| 7,498,622 B1 | | 3/2009 | Chapman et al. | |
| 2001/0010964 A1 | | 8/2001 | Geissler et al. | |
| 2002/0113267 A1 | | 8/2002 | Brown et al. | |
| 2004/0195651 A1 | | 10/2004 | Zhang et al. | |
| 2004/0238894 A1 | | 12/2004 | Furuta | |

FOREIGN PATENT DOCUMENTS

| | | |
|---|---|---|
| EP | 0460861 | 12/1991 |
| JP | 63002370 | 1/1988 |
| JP | 0105055 | 2/1989 |
| JP | 2007150046 | 6/2007 |

OTHER PUBLICATIONS

International Search Report and Written Opinion for corresponding International Application No. PCT/EP2010/053308.
Voldman et al., "Guard Rings: Theory, Experimental Quantification and Design", (Date unknown).
Voldman, "Latchup and the Domino Effect", (Date Unknown).

* cited by examiner

*Primary Examiner* — David Nhu
(74) *Attorney, Agent, or Firm* — Anthony J. Canale; Roberts Mlotkowski Safran & Cole, P.C.

(57) ABSTRACT

A method and structure for preventing latchup. The structure includes a latchup sensitive structure and a through wafer via structure bounding the latch-up sensitive structure to prevent parasitic carriers from being injected into the latch-up sensitive structure.

19 Claims, 3 Drawing Sheets

STRUCTURE AND METHOD FOR LATCHUP IMPROVEMENT USING THROUGH WAFER VIA LATCHUP GUARD RING

FIELD OF THE INVENTION

The invention relates to integrated circuits, and more particularly, to structures and methods for providing latchup improvement using a through wafer via latchup guard ring or structure.

BACKGROUND

Noise isolation and the elimination of complementary metal-oxide semiconductors (CMOS) latchup are significant issues in advanced CMOS technology, radio frequency (RF) CMOS, and bipolar CMOS (BiCMOS) Silicon Germanium (SiGe) technology. Latchup conditions typically occur within peripheral circuits or internal circuits, within one circuit (intra-circuit), or between multiple circuits (inter-circuit). In one such example, latchup occurs when a PNPN structure transitions from a low-current/high-voltage state to a high-current/low-voltage state through a negative resistance region (i.e., forming an S-Type I-V (current/voltage) characteristic).

In particular, latchup is known to be initiated by an equivalent circuit of a cross-coupled PNP and NPN transistor. With the base and collector regions being cross-coupled, current flows from one device leading to the initiation of the second device ("regenerative feedback"). These PNP and NPN elements can be any diffusions or implanted regions of other circuit elements (e.g., p-channel MOSFETs, n-channel MOSFETs, resistors, etc.) or actual PNP and NPN bipolar transistors. In CMOS structures, the PNPN structure can be formed with a p-diffusion in an n-well, and a n-diffusion in a p-substrate ("parasitic PNPN"). In this case, the well and substrate regions are inherently involved in the latchup current exchange between regions in the device.

The condition for triggering a latchup is a function of the current gain of the PNP and NPN transistors, and the resistance between the emitter and the base regions. This inherently involves the well and substrate regions. The likelihood or sensitivity of a particular PNPN structure to latchup is a function of a same combination of spacing (e.g., base width of the NPN and base width of the PNP), current gain of the transistors, substrate resistance and spacings, the well resistance and spacings, and isolation regions.

Latchup can also occur as a result of the interaction of an electrostatic discharge (ESD) device, the input/output (I/O) off-chip driver and adjacent circuitry initiated in the substrate from the overshoot and undershoot phenomena. These factors can be generated by CMOS off-chip driver (OCD) circuitry, receiver networks, and ESD devices. In CMOS I/O circuitry, undershoot and overshoot can lead to injection in the substrate, and simultaneous switching of circuitry where overshoot or undershoot injection occurs may lead to both noise injection and latchup conditions. Also, supporting elements in these circuits, such as pass transistors, resistor elements, test functions, over voltage dielectric limiting circuitry, bleed resistors, keeper networks and other elements can be present, contributing to noise injection into the substrate and latchup.

With the scaling of standard CMOS technology, the spacing of the p+/n+ space decreases, leading to a lower trigger condition and the onset of CMOS latchup. With the scaling of the shallow trench isolation (STI) for aspect ratio, the vulnerability of CMOS technology to latchup has increased. Vertical scaling of the wells, and lower n-well and p-well implant doses also has increased the lateral parasitic bipolar current gains, leading to lower latchup robustness.

With the transition from p+ substrates to low doped p−substrates, the latchup robustness has continued to decrease. Also, the effectiveness of n-wells as guard ring structures may reduce internal and external latchup problems. But, with mixed signal applications and radio frequency (RF) chips, a higher concern for noise reduction has lead to the continued lowering of the substrate doping concentration. This continues to lead to lower latchup immunity in mixed signal applications and RF technologies.

Latchup also can occur from voltage or current pulses that occur on the power supply lines. Transient pulses on power rails (e.g., substrate or wells) can trigger latchup processes. Latchup can also occur from a stimulus to the well or substrate external to the region of a thyristor structure from minority carriers.

Latchup can be initiated from internal or external stimulus, and is known to occur from single event upsets (SEU), which can include terrestrial emissions from nuclear processes, and cosmic ray events, as well as events in space environments. Cosmic ray particles can include proton, neutron, and gamma events, as well as a number of particles that enter the earth atmosphere. Terrestrial emissions from radioactive events, such as alpha particles, and other radioactive decay emissions can also lead to latchup in semiconductors.

For military, surveillance, satellite, and other outer space applications, it is desirable to have a high tolerance to latchup. Latchup can lead to failure of space applications triggered by cosmic rays, heavy ions, proton and neutron events. The higher the latchup margin in military and outer space applications, the higher the vulnerability to single even upset (SEU) initiated latchup.

Accordingly, there exists a need in the art to overcome the deficiencies and limitations described hereinabove.

SUMMARY

In a first aspect of the invention, a method of manufacturing a semiconductor structure comprises forming a latchup sensitive structure, masking the latchup sensitive structure and flipping the latchup sensitive structure and substrate to gain access to an underside thereof. The method further comprises etching a through wafer via (also can be referred to as trough via, or through via) through the substrate and adjacent the latchup sensitive structure using lithography and etching to isolate the latchup sensitive structure from at least an external source.

In embodiments, the through wafer via is filled with a metal material, refractory material, an insulator, or a metal material with an insulator liner. The latchup sensitive structure contains a p+ diffusion structure. The p+ diffusion can be a p+/n−well diode, a PMOS transistor, a P+ resistor, or a pnp bipolar transistor. The latchup sensitive structure also contains a n+ diffusion. The n+ diffusion can be a n+/p− substrate diode, an NMOS transistor, n+ resistor element, or npn bipolar transistor. The p+ diffusion and the n+ diffusion form a parasitic PNPN. The embodiments address CMOS technology, which contains both PMOS and NMOS transistors. The latchup sensitive structure is bounded by the through wafer via to prevent parasitic carriers from being injected into the latchup sensitive structure. The through wafer via is etched to entirely surround the latchup sensitive structure.

In another aspect of the invention, a method of forming a structure comprises: forming at least a P+ diffusion structure that is sensitive to latchup; and forming a guard ring structure bounding the P+ diffusion structure to isolate the P+ diffusion structure from external sources.

In another aspect of the invention, a structure comprises a latchup sensitive structure and a through wafer via structure bounding the latch-up sensitive structure. The through wafer prevents parasitic carriers from being injected into the latch-up sensitive structure.

In embodiments, the latchup sensitive structure is a P+ diffusion structure. The latchup sensitive structure is a CMOS structure. The latchup sensitive structure contains both PMOS and NMOS transistor. The through wafer via isolates the latchup sensitive structure from an external source. The through wafer via is filled with one of: a refractory material, a metal, an insulator and a metal material lined with an insulator. The through wafer via completely surrounds the latchup sensitive structure. The through wafer via partially surrounds the latchup sensitive structure. The through wafer via is a guard ring structure. The through wafer via prevents latchup resulting from a minority injection source.

In another aspect of the invention, a structure comprises: a latchup sensitive structure; and a guard ring that bounds the latchup sensitive structure to isolate the latchup sensitive structure from an external source.

In another aspect of the invention, a design structure is embodied in a machine readable medium for designing, manufacturing, or testing an integrated circuit. The design structure comprises a latchup sensitive structure, and a guard ring that bounds the latchup sensitive structure to isolate the latchup sensitive structure from an external source.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuits, and more particularly, to structures and methods for providing latchup improvement using a through wafer via latchup guard ring or structure. In embodiments, a through wafer via structure bounds a latchup sensitive structure to prevent parasitic carriers from being injected into the latchup sensitive structure. More specifically, in the present invention through wafer vias are used as NMOS, PMOS or CMOS latchup guard rings to minimize the carrier migration to adjacent circuitry. The through-wafer vias can serve as barriers to the minority carrier injection from injection sources observed in NMOS, PMOS or CMOS semiconductor chips.

In embodiments, the guard ring or structure (hereinafter generally referred to as "guard ring") of the present invention serves the purpose of providing electrical and spatial isolation between adjacent circuit elements preventing interaction between devices and circuits that may undergo latchup. This is achieved by the prevention of minority carriers from within a given circuit, or the prevention of minority carriers from entering a sensitive circuit. In the first case, the guard ring prevents the minority carriers from leaving the region of the circuit and influencing the surrounding circuitry. In the second case, the injection is external to the circuit, and the guard ring prevents the minority carriers from influencing the circuit of interest.

In embodiments, the guard ring provides electrical isolation between a PNP and NPN structure. In this case, the guard ring minimizes the electrical coupling, and prevents regenerative feedback from occurring between the PNP and the NPN. That is, the guard ring lowers the gain of the feedback loop by reducing the parasitic current gain. Guard rings within the PNPN structures lower the parasitic bipolar gain by, for example:

Increasing the base width of the parasitic PNP or NPN structure;

Providing a region of collection of the minority carriers to the substrate or power supply electrodes, "collecting" the minority carrier via a metallurgical junction or electrical connection; and Providing a region of heavy doping concentration to increase the recombination within the parasitic, "capturing" the minority carrier via electron-hole pair recombination.

In external latchup, the guard ring provides electrical isolation between a first and second region; the role of the guard ring is not to minimize the electrical coupling between the local PNP and the NPN transistor but serve as the role of prevention of injection mechanisms traverse from a first to a second region. In this case, the guard ring lowers the minority carrier injection from an exterior region into the circuit region of interest.

Figure 1:
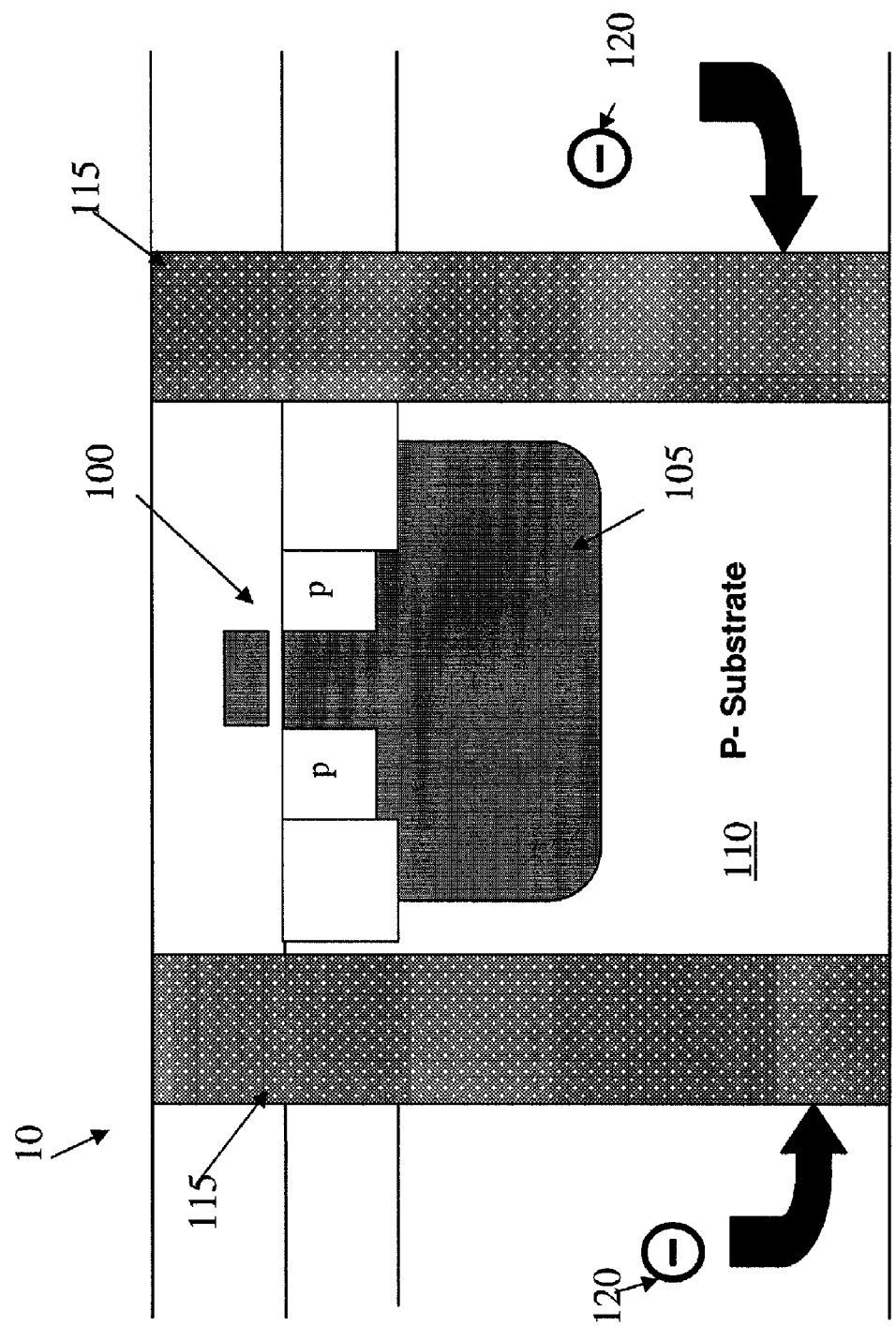
FIG. 1 shows a semiconductor structure in accordance with a first aspect of the invention.

FIG. 1 shows a semiconductor structure in accordance with a first aspect of the invention. Specifically, FIG. 1 shows a structure generally depicted at reference numeral 10. The structure 10, in one embodiment, is a Pfet 100 sitting in a N-well 105. Those of skill in the art should understand that the present invention is equally applicable to NMOS and CMOS structures, and that the present invention should not be limited to a Pfet. Also, the present invention is discussed with reference to a Pfet structure only for ease of explanation, and as such, this should not be construed as a limiting feature of the present invention.

Referring to FIG. 1, the Pfet 100 can be any P+ diffusion in an N-well. For example, the P+ diffusion can be a P+ diode, a decoupling capacitor, a PNP, e.g., a thyristor (also known as a silicon controlled rectifier (SCR), or any P+ shape device that causes a parasitic PNP with the substrate 110. In embodiments, the substrate 110 is a P− substrate. In the case of a NMOS structure, an Nfet can be any N− diffusion.

As further shown in FIG. 1, a through wafer via guard ring 115 surrounds or partially surrounds the structure 10. The through wafer via guard ring 115 provides protection, e.g., a barrier or isolation, to the structure 10 from external sources. The through wafer via structures can be a single side, two sides, three sides or four sides. The through wafer via barrier is not limited to Cartesian coordinates, but can be any polygon, arc or circular structure.

In embodiments, the guard ring 115 is formed from the backside of the substrate 110 using conventional etching processes, e.g., reactive ion etching (RIE). More specifically, after standard device formation, a mask can be placed on the top of the structure, the structure then flipped over and a via is etched through the substrate using conventional lithography and etching processes. After the etching process, the via can be filled with different materials, depending on the particular application. These materials can be a refractory metal, aluminum, an insulator, or a metal material with an insulator liner. In embodiments, the via can also be left empty, i.e., not filled.

The structure is then polished using conventional polishing techniques such as, for example, chemical mechanical polishing.

The guard ring 115 can be formed in many different locations, according to aspects of the invention. For example, the guard ring 115 can completely surround the structure 10, or can partially surround the structure 10. In the case of partially surrounding the structure, the guard ring 115 would also be known as a guard structure. For example, in the latter embodiment, the guard ring 115 can be arranged on one, two or three sides of the structure 10. In further embodiments, the guard ring 115 can be of different shapes such as, for example, an arc shape or several overlapping arc shapes.

The guard ring(s) 115 provides a barrier or isolation structure to the structure 10 from external sources depicted at reference numeral 120. These external sources 120 can be, for example, from other devices, from alpha particles, cosmic rays, noise, cable discharge events, heavy ions, or any single event latchup, to name a few. As further examples, the guard ring 115 can prevent injection from a second source such as, for example, sub circuits, ESD devices, high voltage logic and the like. In operation, for example, when the guard ring 115 is composed of a metal material, for example, the external source will contact the metal and sink to the substrate. In other embodiments, minority carriers can recombine at the metal surface similar to a Schottky barrier. Also, the guard ring 115 can act as a blocking source, preventing the external source of even entering conducting with the guard ring 115.

Figure 2:
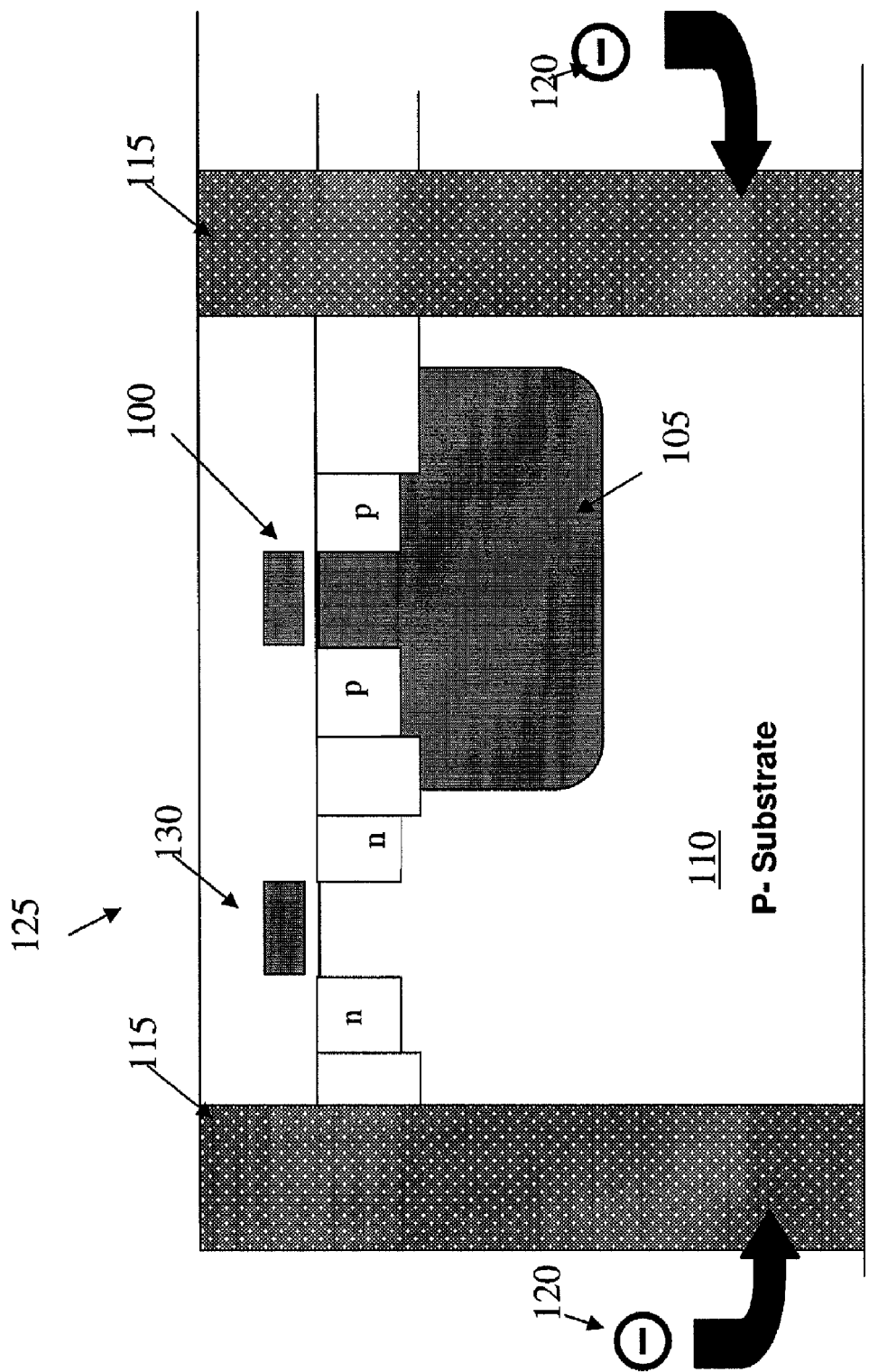
FIG. 2 shows a semiconductor structure in accordance with a second aspect of the invention.

FIG. 2 shows a semiconductor structure in accordance with a second aspect of the invention. In FIG. 2, a CMOS structure 125 is shown constrained by the guard ring 115. The CMOS structure 125 includes an Nfet 130 and a Pfet 100. As thus shown, the Nfet 130 and a Pfet 100 can be core logic circuits constrained in a physical location by the guard ring 115. Similar to the embodiment shown in FIG. 1, the Pfet 100 can be any P+ diffusion in a N-well. For example, the P+ diffusion can be a P+ diode, a decoupling capacitor, a PNP, e.g., a thyristor, or any P+ shape device that causes a parasitic PNP with the substrate 110. In embodiments, the substrate 110 is a P− substrate.

Similar to that discussed with reference to FIG. 1, the guard ring 115 is formed from the backside of the substrate 110 using conventional etching processes, e.g., reactive ion etching (RIE). More specifically, after standard device formation of the CMOS device, a mask can be placed on the top of the structure, the structure then flipped over and a via is etched through the substrate using conventional lithography and etching processes. The via can be filled with refractory metal, aluminum, an insulator, or a metal material with an insulator liner, to name a few different combinations. In embodiments, the via can also be left empty, i.e., not filled. The structure is then polished using conventional polishing techniques such as, for example, chemical mechanical polishing.

The guard ring 115 can be formed in many different locations such as, for example, completely or partially surrounding the CMOS structure 125. In the case of partially surrounding the structure, the guard ring would also be known as a guard structure, and can be arranged on one, two or three sides of the CMOS structure 125. In further embodiments, the guard ring 115 can be of different shapes such as, for example, an arc shape or several overlapping arc shapes.

Figure 3:
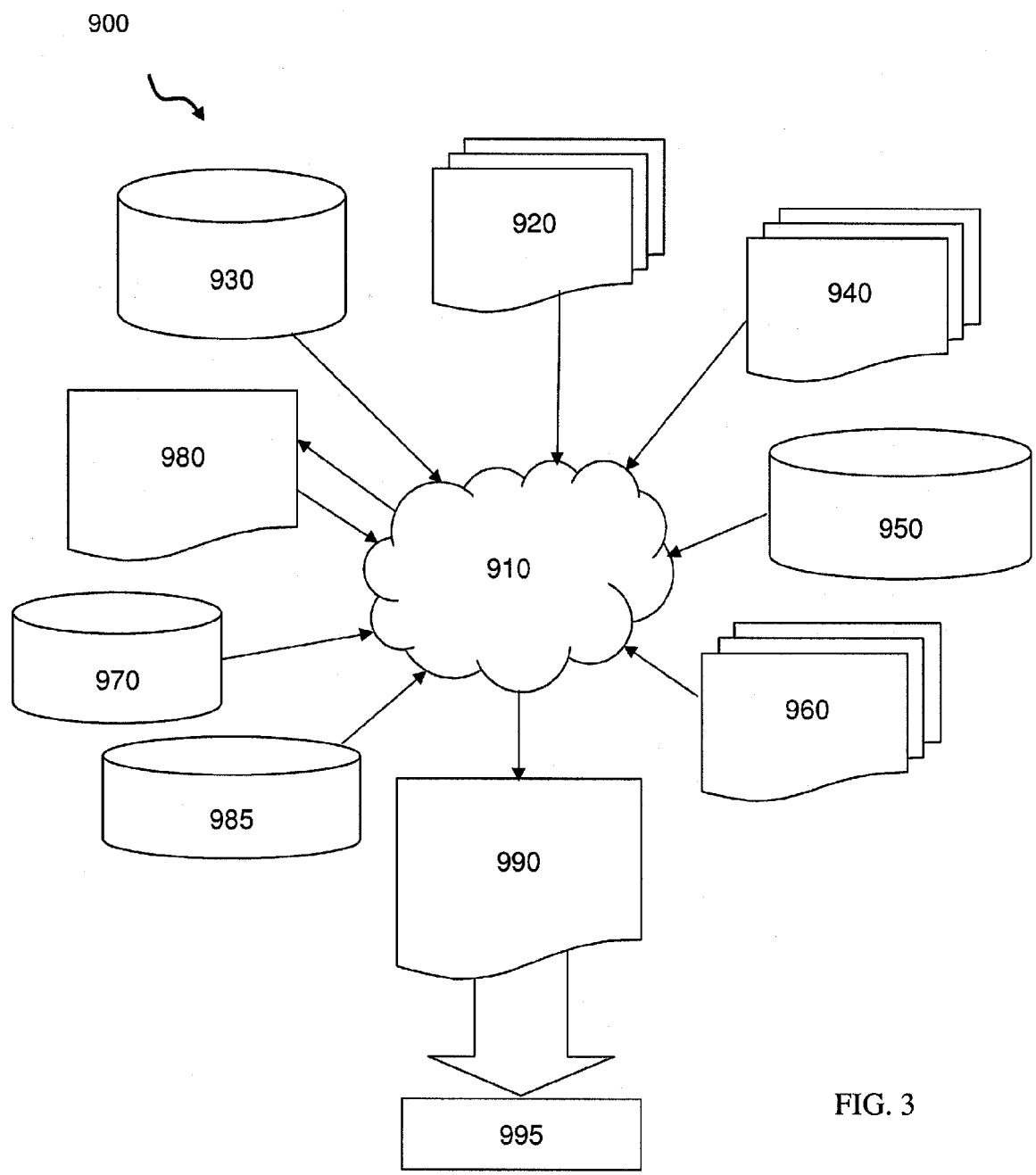
FIG. 3 shows a flow diagram implementing process steps in accordance with the invention.

In the embodiment of FIG. 2, the guard ring(s) 115 can prevent latchup of the CMOS resulting from a minority injection source. For example, the guard ring(s) 115 can isolate the CMOS structure from a high voltage device. In one example, the high voltage device can be approximately 2.3 to 2.5 volt logic that would disrupt the Pfet that is a low voltage, e.g., 1.8 volt, device. DESIGN STRUCTURE FIG. 3 shows a block diagram of an exemplary design flow 900 used for example, in semiconductor IC logic design, simulation, test, layout, and manufacture. Design flow 900 includes processes and mechanisms for processing design structures to generate logically or otherwise functionally equivalent representations of the embodiments of the invention shown in FIGS. 1 and 2. The design structures processed and/or generated by design flow 900 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 3 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1 and 2. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1 and 2 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include modules for performing standard circuit design processes such as timing analysis, verification, design rule checking, place and route operations, etc.

Design process 910 employs and incorporates well-known logic and physical design tools such as HDL compilers and simulation model build tools to process design structure 920 together with some or all of the depicted supporting data structures to generate a second design structure 990. Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1 and 2. In one embodiment, design structure 990 may comprise a compiled, executable HDL simulation model that functionally simulates the devices shown in FIGS. 1 and 2.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in FIGS. 1 and 2. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of manufacturing a semiconductor structure, the method comprising:
    forming a latchup sensitive structure;
    masking the latchup sensitive structure;
    flipping the latchup sensitive structure and a substrate to gain access to an underside thereof; and
    etching a trough via through the substrate and adjacent the latchup sensitive structure using lithography and etching to isolate the latchup sensitive structure from at least an external source.

2. The method of claim 1, wherein the trough via is filled with a metal material, refractory material, an insulator, or a metal material with an insulator liner.

3. The method of claim 1, wherein the latchup sensitive structure is a P+ diffusion structure.

4. The method of claim 1, wherein the latchup sensitive structure is a CMOS structure.

5. The method of claim 1, wherein the latchup sensitive structure is a N+ diffusion structure.

6. The method of claim 1, wherein the latchup sensitive structure is bounded by the through wafer via to prevent parasitic carriers from being injected into the latchup sensitive structure.

7. The method of claim 1, wherein the through wafer via is etched to entirely surround the latchup sensitive structure.

8. A method of forming a structure, the method comprising:
    forming at least a P+ diffusion structure that is sensitive to latchup; and
    forming a guard ring structure through an underside of a substrate to bound hounding the P+ diffusion structure to isolate the P+ diffusion structure from external sources.

9. The method of claim 8, wherein the guard ring structure completely surrounds the P+ diffusion structure and is filled with metal, refractory material, an insulator or a metal lined with an insulator.

10. The method of claim 8, further comprising forming at least a N− diffusion structure that is sensitive to latchup and which is bounded by the guard ring structure.

11. The method of claim 8, further comprising masking the P+ diffusion structure;

flipping the P+ diffusion structure and the substrate to gain access to an underside thereof; and etching a trough via through the substrate and adjacent the P+ diffusion structure for the guard ring structure, which isolates the P+ diffusion structure from at least an external source.

12. The method of claim 11, wherein the etching includes lithography and etching processes.

13. The method of claim 12, wherein the etching is a reactive ion etching.

14. The method of claim 11, wherein the forming the guard ring structure includes forming a through wafer via which surrounds or partially surrounds the P+ diffusion structure.

15. The method of claim 14, wherein the through wafer via structures is one of a single side, two sides, three sides and four sides.

16. The method of claim 14, wherein the through wafer via barrier is formed as any polygon, arc or circular structure.

17. The method of claim 14, further comprising filling the through wafer with refractory metal, aluminum, an insulator, or a metal material with an insulator liner.

18. The method of claim 14, wherein the through wafer is left empty.

19. A method of manufacturing a semiconductor structure, the method comprising:

forming a latchup sensitive structure on a substrate; and forming a guard structure by etching a trough via from an underside of the substrate and adjacent the latchup sensitive structure using lithography and etching to isolate the latchup sensitive structure from at least an external source.

* * * * *